(12) United States Patent
Yokomichi

(10) Patent No.: US 7,501,609 B2
(45) Date of Patent: Mar. 10, 2009

(54) IMAGE SENSOR WITH LINEARLY MOUNTED IMAGE SENSOR IC'S

(75) Inventor: Masahiro Yokomichi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/346,828

(22) Filed: Feb. 3, 2006

(65) Prior Publication Data

US 2006/0192079 A1 Aug. 31, 2006

Related U.S. Application Data

(62) Division of application No. 10/854,871, filed on May 27, 2004, now abandoned.

(30) Foreign Application Priority Data

May 27, 2003 (JP) .............................. 2003-149267

(51) Int. Cl.
*H01L 27/00* (2006.01)
(52) U.S. Cl. ................................ 250/208.1; 250/214 R; 348/294; 348/300
(58) Field of Classification Search .............. 250/208.1, 250/214 R; 348/294, 300–302
See application file for complete search history.

(56) References Cited

U.S. PATENT DOCUMENTS

| 6,133,862 | A | * | 10/2000 | Dhuse et al. ................. 341/118 |
| 6,429,413 | B1 | * | 8/2002 | Kawahara et al. ......... 250/208.1 |
| 2004/0135064 | A1 | * | 7/2004 | Mabuchi .................. 250/208.1 |

* cited by examiner

*Primary Examiner*—Stephen Yam
(74) *Attorney, Agent, or Firm*—Adams & Wilks

(57) ABSTRACT

An image sensor has image sensor ICs mounted linearly thereon. Each of the image sensor ICs comprises a light receiving device circuit array having light receiving devices, a reset circuit device array, and a plurality of switches. The light receiving devices have output terminals that output output signals in accordance with an amount of light received. The reset circuit device array initializes the output terminals of the light receiving devices in an initialization mode. The switches drive the reset circuit device array and are configured to be maintained in a conductive state during an accumulation period so that an initialization potential is outputted by the output terminal of each of the light receiving devices of one of only a first one of the linear image sensor ICs, only a last one of the linear image sensor ICs, and all of the linear image sensor ICs.

1 Claim, 19 Drawing Sheets

FIG. 21

| TERMINAL/DEVICE NAME \ RESOLUTION | a*1/8 [dpm] [dpi] | a*1/6 [dpm] [dpi] | a*1/4 [dpm] [dpi] | a*1/2 [dpm] [dpi] | a [dpm] [dpi] |
|---|---|---|---|---|---|
| X1 | L | H | L | H | L |
| X2 | L | H | H | L | L |
| X3 | H | L | L | L | L |
| X4 | L | L | L | L | L |
| 3-n-1 | ON | ON | ON | ON | OFF |
| 3-n-2 | ON | ON | ON | OFF | OFF |
| 3-n-3 | ON | ON | ON | ON | OFF |
| 3-n-4 | ON | ON | OFF | OFF | OFF |
| 3-n-5 | ON | ON | ON | ON | OFF |
| 3-n-6 | ON | OFF | ON | OFF | OFF |
| 3-n-7 | ON | ON | ON | ON | OFF |
| 3-n-8 | OFF | ON | OFF | OFF | OFF |
| 3-n-9 | ON | ON | ON | ON | OFF |
| 3-n-10 | ON | ON | ON | OFF | OFF |
| 3-n-11 | ON | ON | ON | ON | OFF |
| 3-n-12 | ON | OFF | OFF | OFF | OFF |
| 3-n-13 | ON | ON | ON | ON | OFF |
| 3-n-14 | ON | ON | ON | OFF | OFF |
| 3-n-15 | ON | ON | ON | ON | OFF |
| 3-n-16 | OFF | ON | OFF | OFF | OFF |
| 3-n-17 | ON | ON | ON | ON | OFF |
| 3-n-18 | ON | OFF | ON | OFF | OFF |
| 3-n-19 | ON | ON | ON | ON | OFF |
| 3-n-20 | ON | ON | OFF | OFF | OFF |
| 3-n-21 | ON | ON | ON | ON | OFF |
| 3-n-22 | ON | ON | ON | OFF | OFF |
| 3-n-23 | ON | ON | ON | ON | OFF |
| 3-n-24 | OFF | OFF | OFF | OFF | OFF |
| ΦRST1 | NORMAL | NORMAL | NORMAL | NORMAL | NORMAL |
| ΦRST2 | NORMAL | NORMAL | NORMAL | NORMAL | NORMAL |

FIG. 22

| TEST MODE<br>TERMINAL/<br>DEVICE NAME | TEST1 | TEST2 | TEST3 |
|---|---|---|---|
| X1 | H | L | H |
| X2 | L | H | H |
| X3 | H | H | H |
| X4 | L | L | L |
| 3-n-1 | OFF | ON | OFF |
| 3-n-2 | ON | OFF | OFF |
| 3-n-3 | OFF | ON | OFF |
| 3-n-4 | ON | OFF | OFF |
| 3-n-5 | OFF | ON | OFF |
| 3-n-6 | ON | OFF | OFF |
| 3-n-7 | OFF | ON | OFF |
| 3-n-8 | ON | OFF | OFF |
| 3-n-9 | OFF | ON | OFF |
| 3-n-10 | ON | OFF | OFF |
| 3-n-11 | OFF | ON | OFF |
| 3-n-12 | ON | OFF | OFF |
| 3-n-13 | OFF | ON | OFF |
| 3-n-14 | ON | OFF | OFF |
| 3-n-15 | OFF | ON | OFF |
| 3-n-16 | ON | OFF | OFF |
| 3-n-17 | OFF | ON | OFF |
| 3-n-18 | ON | OFF | OFF |
| 3-n-19 | OFF | ON | OFF |
| 3-n-20 | ON | OFF | OFF |
| 3-n-21 | OFF | ON | OFF |
| 3-n-22 | ON | OFF | OFF |
| 3-n-23 | OFF | ON | OFF |
| 3-n-24 | ON | OFF | OFF |
| ΦRST1 | NORMAL | NORMAL | NORMAL |
| ΦRST2 | CONSTANTLY H | CONSTANTLY H | CONSTANTLY H |

FIG. 23

| RESOLUTION<br>TERMINAL/<br>DEVICE NAME | a*1/8<br>[dpm]<br>[dpi] | a*1/6<br>[dpm]<br>[dpi] | a*1/4<br>[dpm]<br>[dpi] | a*1/2<br>[dpm]<br>[dpi] | a<br>[dpm]<br>[dpi] |
|---|---|---|---|---|---|
| X1 | L | H | L | H | L |
| X2 | L | H | H | L | L |
| X3 | H | L | L | L | L |
| X4 | H | H | H | H | H |
| 3-n-1 | ON | ON | ON | ON | OFF |
| 3-n-2 | ON | ON | ON | OFF | OFF |
| 3-n-3 | ON | ON | ON | ON | OFF |
| 3-n-4 | ON | ON | OFF | OFF | OFF |
| 3-n-5 | ON | ON | ON | ON | OFF |
| 3-n-6 | ON | OFF | ON | OFF | OFF |
| 3-n-7 | ON | ON | ON | ON | OFF |
| 3-n-8 | OFF | ON | OFF | OFF | OFF |
| 3-n-9 | ON | ON | ON | ON | OFF |
| 3-n-10 | ON | ON | ON | OFF | OFF |
| 3-n-11 | ON | ON | ON | ON | OFF |
| 3-n-12 | ON | OFF | OFF | OFF | OFF |
| 3-n-13 | ON | ON | ON | ON | OFF |
| 3-n-14 | ON | ON | ON | OFF | OFF |
| 3-n-15 | ON | ON | ON | ON | OFF |
| 3-n-16 | OFF | ON | OFF | OFF | OFF |
| 3-n-17 | ON | ON | ON | ON | OFF |
| 3-n-18 | ON | OFF | ON | OFF | OFF |
| 3-n-19 | ON | ON | ON | ON | OFF |
| 3-n-20 | ON | ON | OFF | OFF | OFF |
| 3-n-21 | ON | ON | ON | ON | OFF |
| 3-n-22 | ON | ON | ON | OFF | OFF |
| 3-n-23 | ON | ON | ON | ON | OFF |
| 3-n-24 | OFF | OFF | OFF | OFF | OFF |
| ΦRST1 | ACCUMULATION PERIOD H | ACCUMULATION PERIOD H | ACCUMULATION PERIOD H | ACCUMULATION PERIOD H | ACCUMULATION PERIOD H |
| ΦRST2 | ACCUMULATION PERIOD H | ACCUMULATION PERIOD H | ACCUMULATION PERIOD H | ACCUMULATION PERIOD H | ACCUMULATION PERIOD H | ns.
IMAGE SENSOR WITH LINEARLY MOUNTED IMAGE SENSOR IC'S

CROSS-REFERENCE TO RELATED APPLICATIONS

This application is a divisional application of U.S. patent application Ser. No. 10/854,871 filed May 27, 2004 now abandoned and claiming a priority date of May 27, 2003.

BACKGROUND OF THE INVENTION

1. Field of the Invention

The present invention relates to a contact image sensor. More specifically, the invention relates to a contact image sensor, image scanner, facsimile machine, copying machine, or the like capable of correcting dark output for each pixel with ease and high precision and capable of switching between different resolution levels.

2. Description of the Related Art

There have previously been proposed contact image sensors in which dummy pixels are created from as many photodiodes, which are of the same type as used for light receiving devices. The photodiodes within a block are provided for dark correction separate from a light receiving device array and shielded against light to avoid incidence of light from above the pixels.

FIG. 20 is a circuit diagram showing an integrated circuit for a prior art contact image sensor. In this prior art, dummy pixels 121" for dark correction are created from n (n represents the number of pixels within one block) photodiodes, which are each denoted by $P_{O,j}$ (j=1 through n) and are of the same type as used for light receiving devices, which constituted a dummy pixel array 121' separate from a light receiving device array 111. Provided for dark correction, the dummy pixels 121" are shielded against light to avoid incidence of light from above the pixels. The photodiode $P_{O,j}$ of each of the dummy pixels 121", is connected to the drain electrode side of its switching device, namely, a thin film transistor $T_{O,j}$ (j=1 through n) of a dummy pixel charge transfer unit 122. A gate electrode of the thin film transistor $T_{O,j}$ is connected through a common gate line $G_0$ to a gate pulse generating circuit 116, from which a gate pulse $\phi\, G_0$ is outputted to control on/off of the thin film transistor $T_{O,j}$. As shown in FIG. 20, a source electrode of each thin film transistor $T_{O,j}$, connected to the respective dummy pixels 121", is connected through a multilayer wire 113 to a common signal line 114 similar to a source electrode of a thin film transistor $T_{O,j}$. Wiring capacitance $CL_j$ (j=1 through n) is formed in each common signal line 114, so that electric charges outputted from light receiving devices 111" or from the dummy pixels 121" are transferred to and accumulated in the respective wiring capacitance. A driver IC 115 reads the electric potential of the common signal line 114 after the electric potential is raised by the electric charges transferred to and accumulated in the wiring capacitance. The driver IC 115 then outputs, in time series, image information via an output terminal 117. Since the dummy pixels 121" are shielded against light, electric charges generated in each of the dummy pixels 121", in the dark state when the thin film transistor $T_{O,j}$ is turned on, are transferred to and accumulated in the wiring capacitance $CL_j$ of the common signal line 114 to be read as the voltage value by the driver IC 115. The voltage value read is outputted as image information in the dark state in each common signal line 114 that includes the wiring capacitance $CL_j$ (see JP 06-113136 A, for example).

In a conventional image sensor IC structured as above, there is a difference in load capacitance between light receiving devices because dummy pixels are shielded against light. Furthermore, since the dummy pixels in the conventional image sensor IC are arranged separate from the light receiving devices, which means that different common signal lines and different pixels are used, it is difficult to make the dark level match while factoring in unbalance due to a difference in wiring capacitance level between common signal lines, fixed pattern noise inherent to individual ICs due to a voltage drop that results from power supply line resistance unique to long ICs, switching noise, and temperature characteristics.

SUMMARY OF THE INVENTION

The present invention has been made to solve the above problems, and an object of the present invention is therefore to provide an image sensor mounted with linearly-arranged, plural linear image sensor ICs in which light receiving devices within the ICs are forcedly reset and initialized with a control signal in order to output a dark level arbitrarily during an accumulation period and in which the same light receiving devices, the same sample & hold circuits, and the same common signal line are used so that the dark level can be corrected with high precision while factoring in fixed pattern noise inherent to individual ICs due to a voltage drop that results from power supply line resistance unique to long ICs, switching noise, and temperature characteristics. The image sensor of the present invention also has switch devices for interconnecting output terminals of all of plural light receiving devices each of which outputs an output signal corresponding to an amount of light received. The switch devices are arbitrarily turned on in accordance with the target level of resolution which ranges from the highest resolution to 1/n of the highest resolution, and the average of outputs of the light receiving devices is held at the same electric potential in the respective sample & hold circuits. This makes it possible to increase the reading speed by reading only relevant data defined by the resolution and skipping unnecessary data, while ensuring that there is no missing data of output-signals of the light receiving devices.

BRIEF DESCRIPTION OF THE DRAWINGS

In the accompanying drawings:

FIG. 3 is a time chart for when a resolution is a highest resolution a;

FIG. 21 shows settings of switches between light receiving devices in FIG. 2 at the respective resolution levels;

FIG. 22 shows settings for testing functions of the switch devices between the light receiving devices in FIG. 2; and FIG. 23 shows settings for outputting initialization potential of the light receiving devices in FIG. 2.

DETAILED DESCRIPTION OF THE PREFERRED EMBODIMENT

Figure 1:
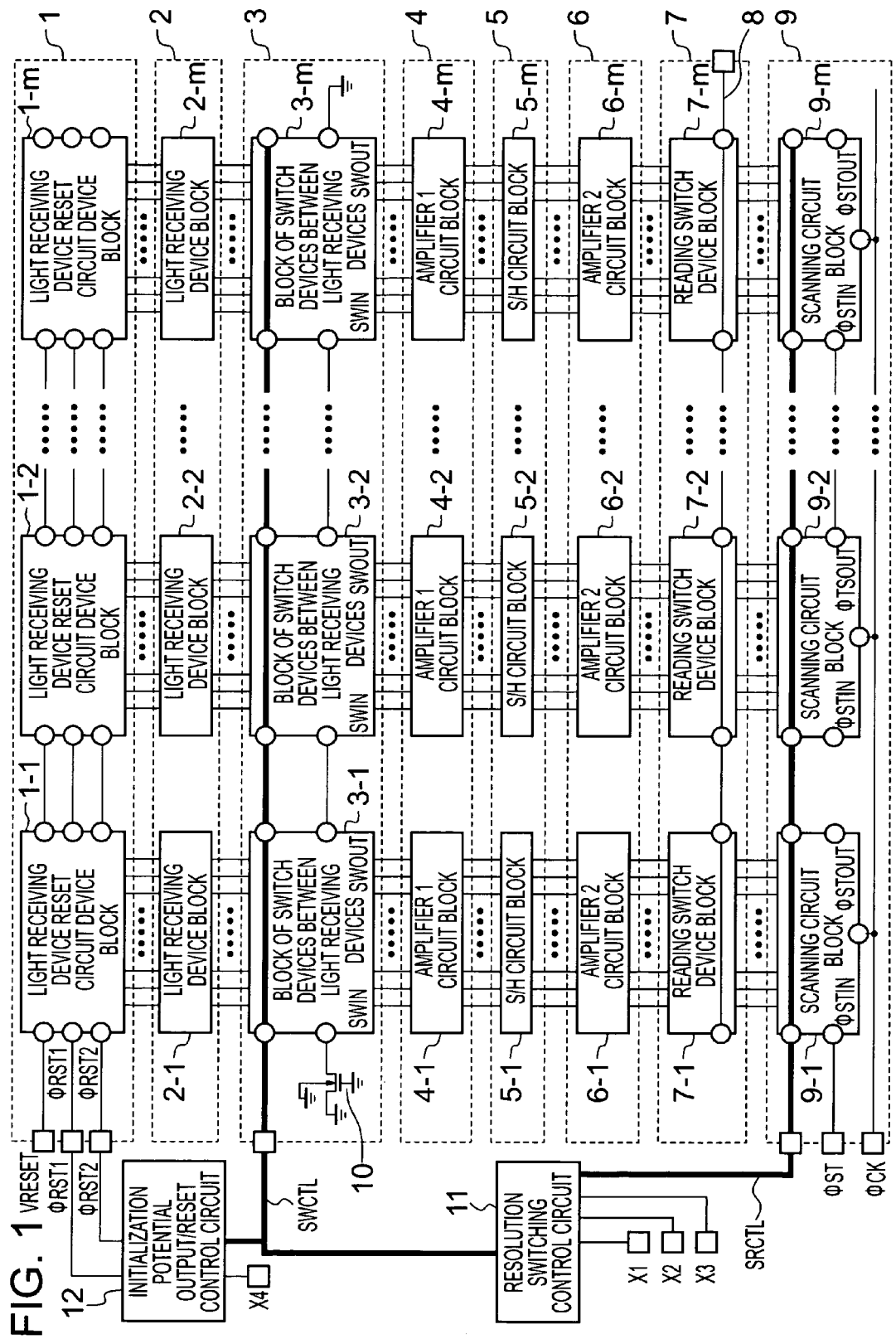
FIG. 1 is an overall circuit diagram of an image sensor according to an embodiment of the present invention.
Figure 2:
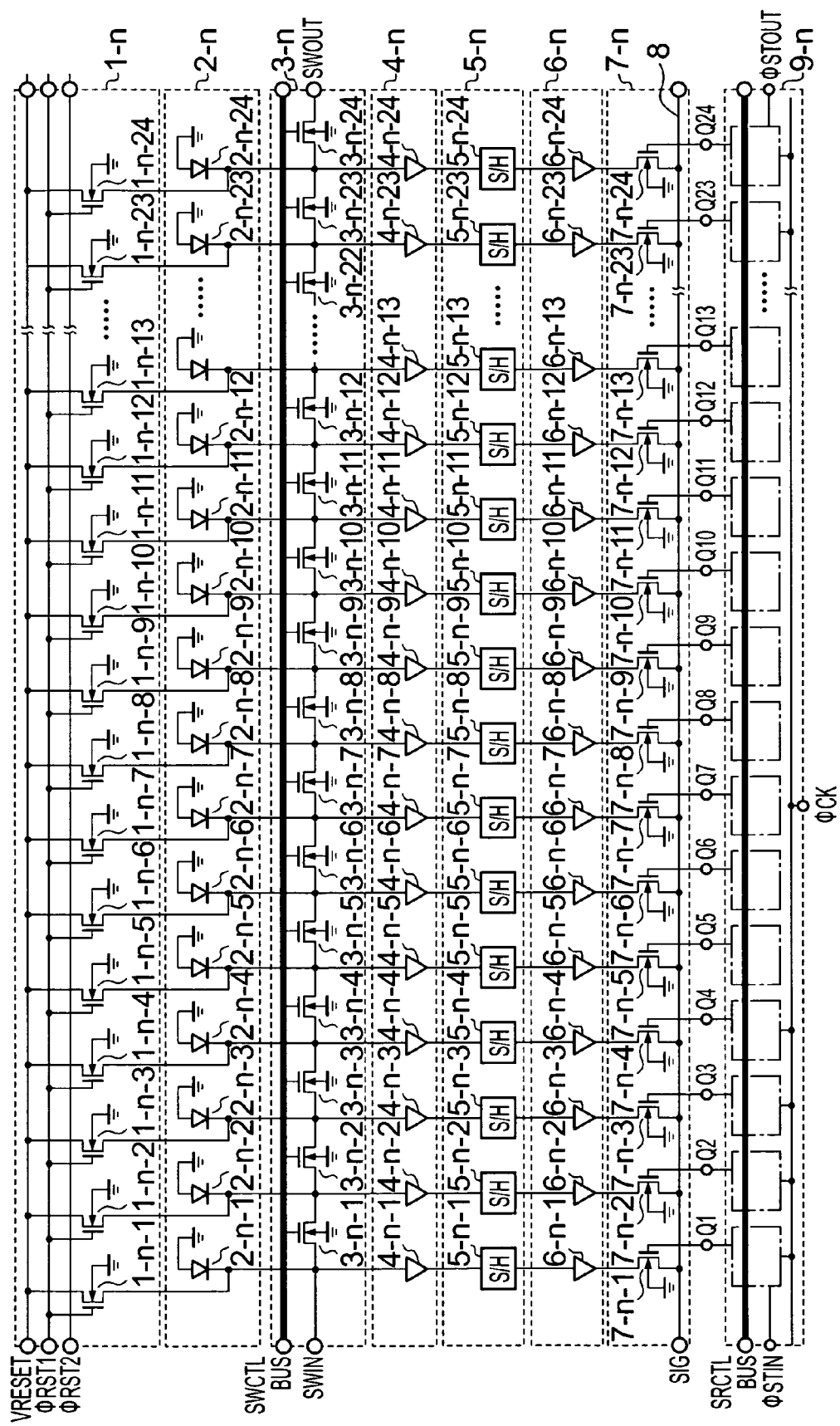
FIG. 2 is a circuit diagram of n-th blocks in FIG. 1.

An embodiment of the present invention will be described below with reference to the drawings. FIG. 1 is an overall circuit diagram of an image sensor according to an embodiment of the present invention. FIG. 2 is a circuit diagram of n-th blocks in FIG. 1. FIG. 21 shows the settings of switches 3-$n$-1, -2, -3, . . . -24, which are interposed between light receiving devices in FIG. 2. FIG. 22 shows the settings for a test of the switches 3-$n$-1, -2, -3, . . . -24 between light receiving devices in FIG. 2.

Figure 3:
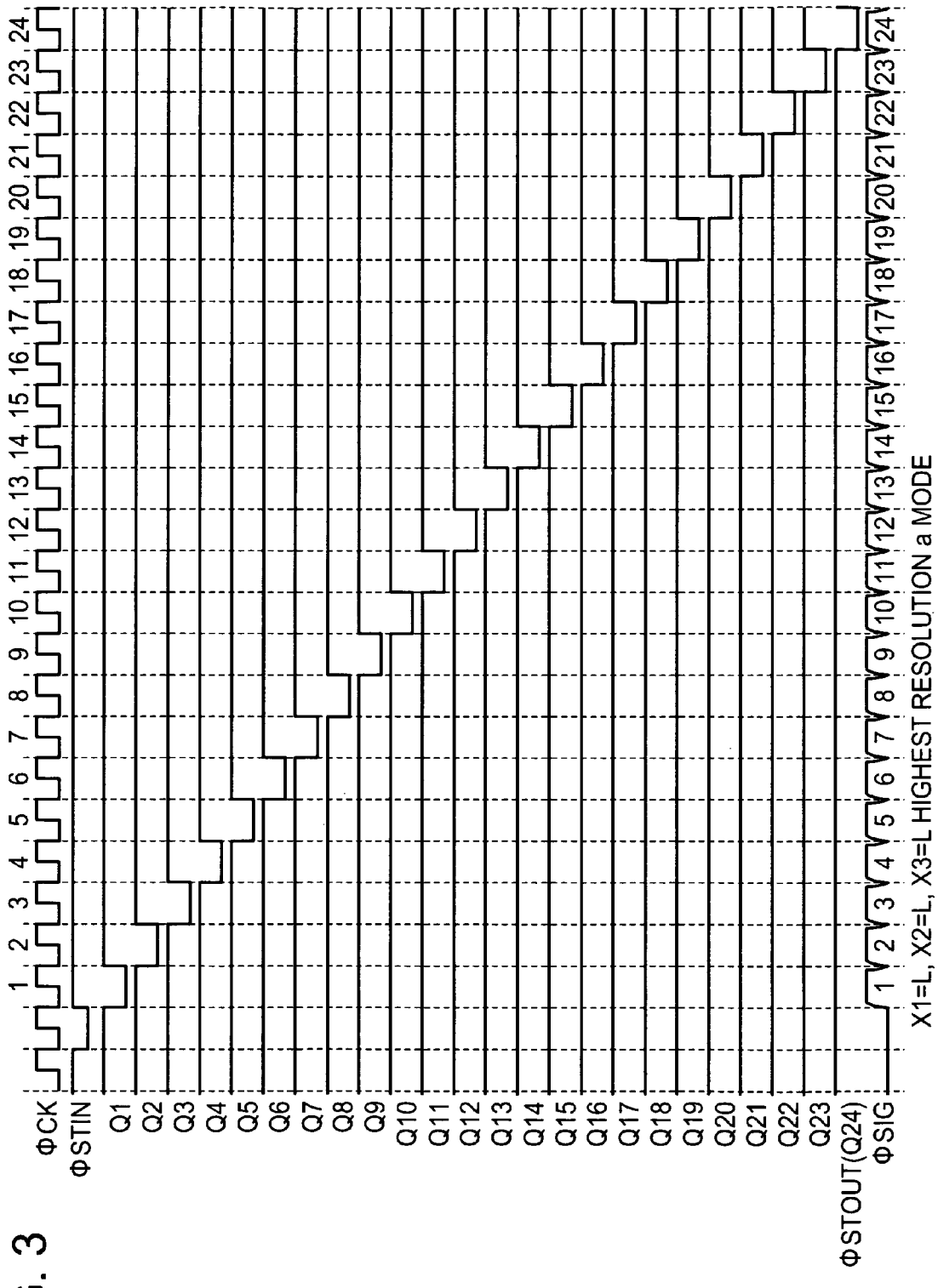
Figure 4:
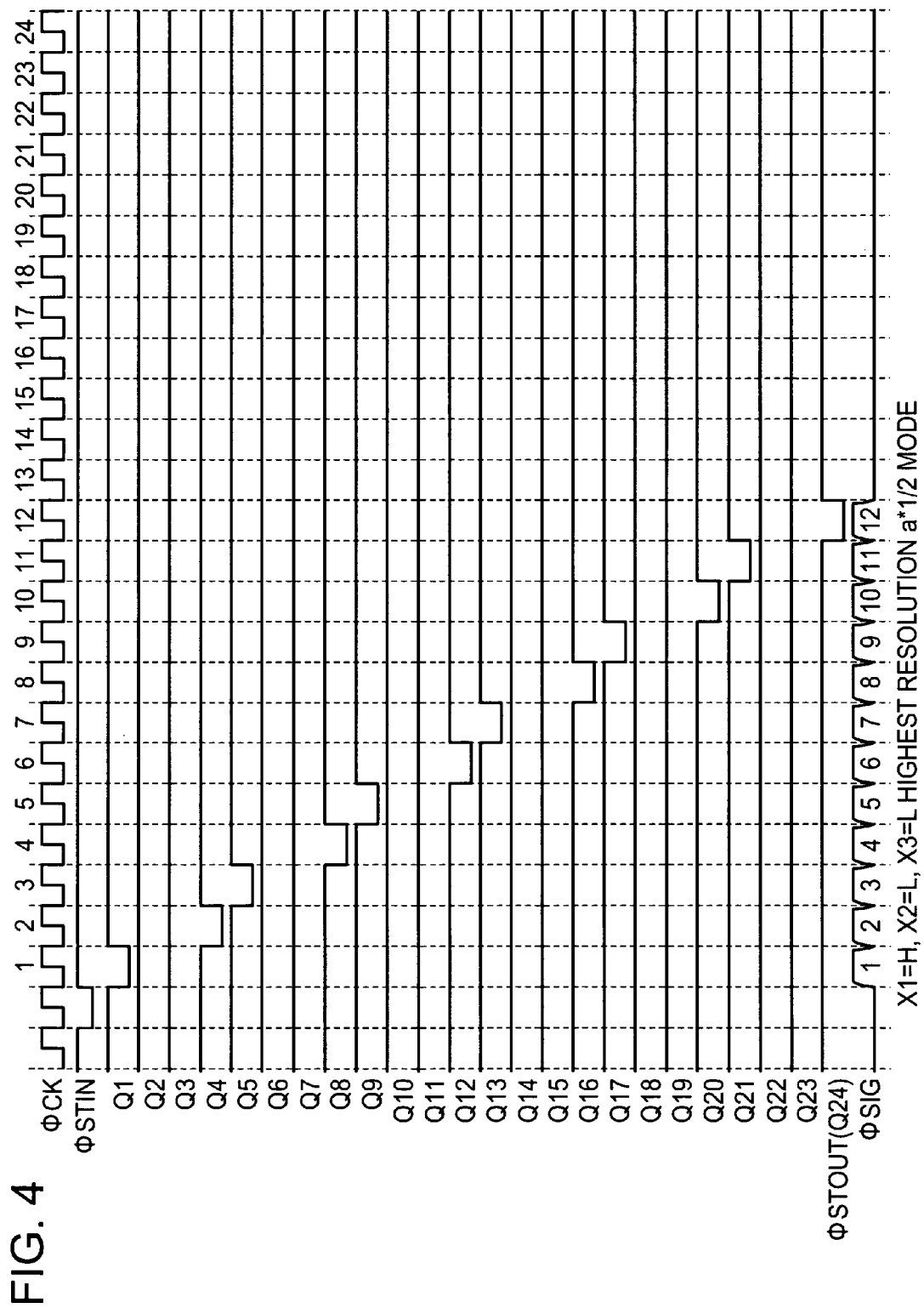
FIG. 4 is a time chart for when the resolution is the highest resolution a×½.
Figure 5:
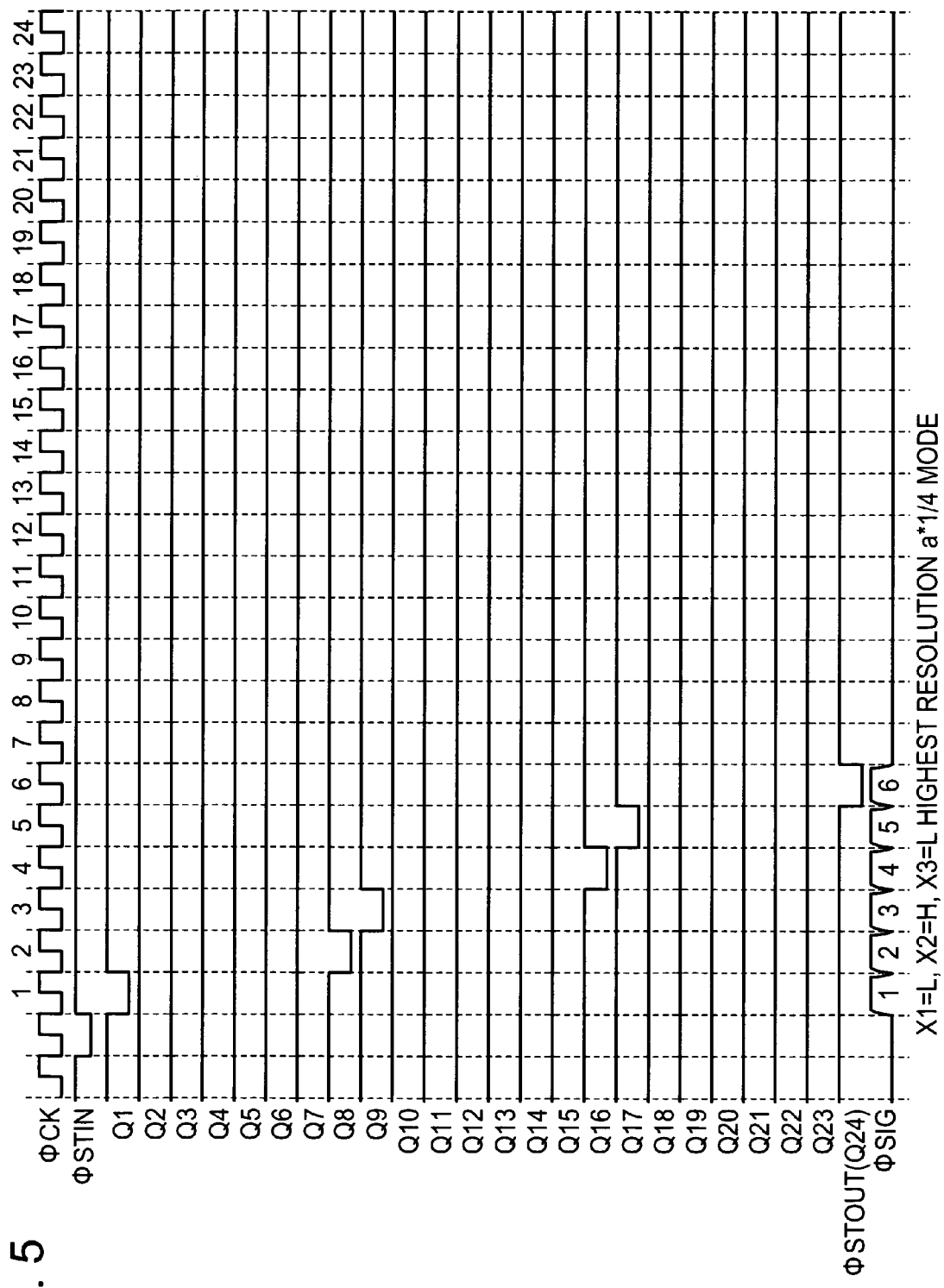
FIG. 5 is a time chart for when the resolution is the highest resolution a×¼.

FIG. 3 is a time chart for when the resolution is a highest resolution a. FIG. 4 is a time chart for when the resolution is a highest resolution a×½. FIG. 5 is a time chart for when the resolution is the highest resolution a×¼.

Figure 6:
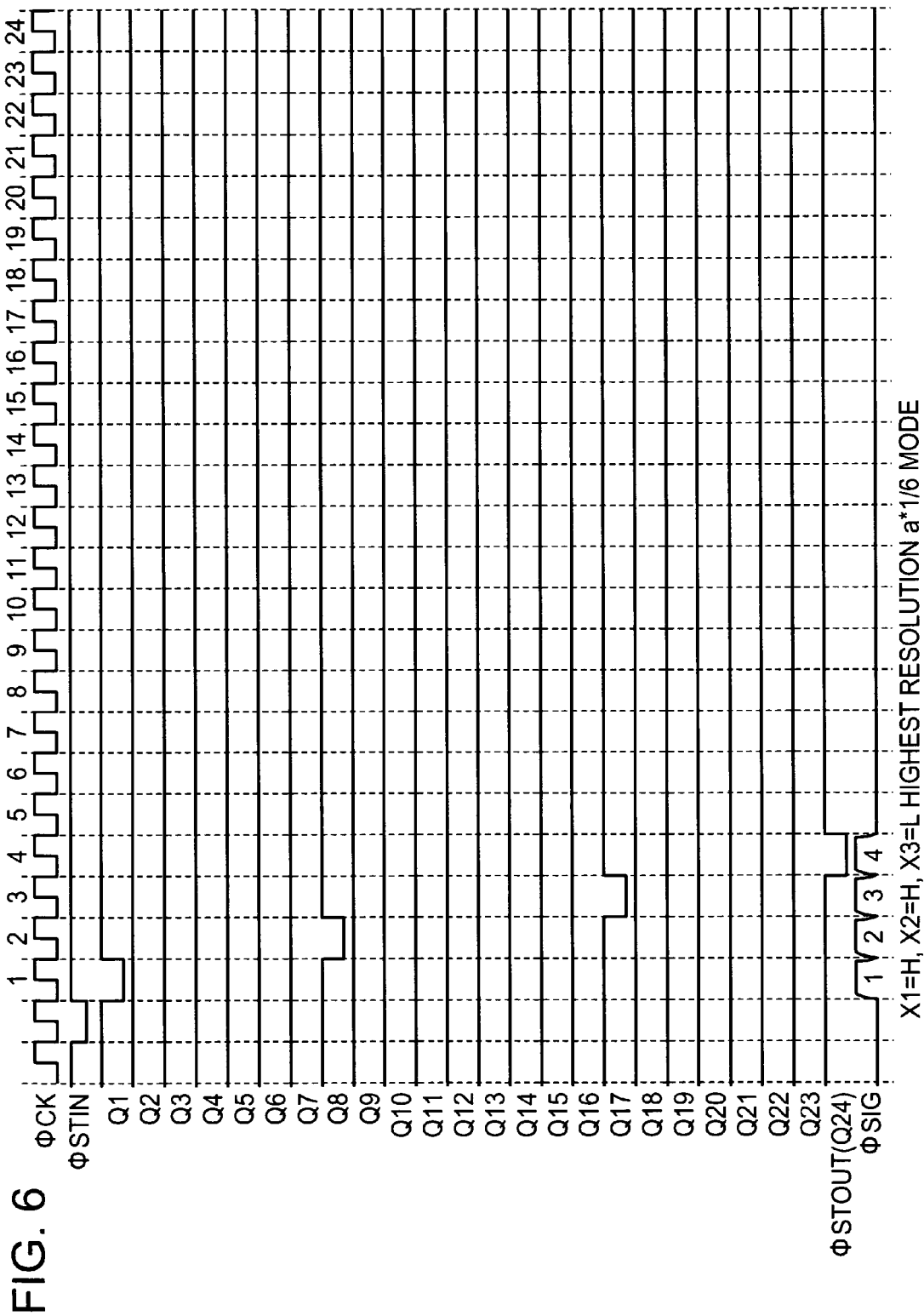
FIG. 6 is a time chart for when the resolution is the highest resolution a×⅙.
Figure 7:
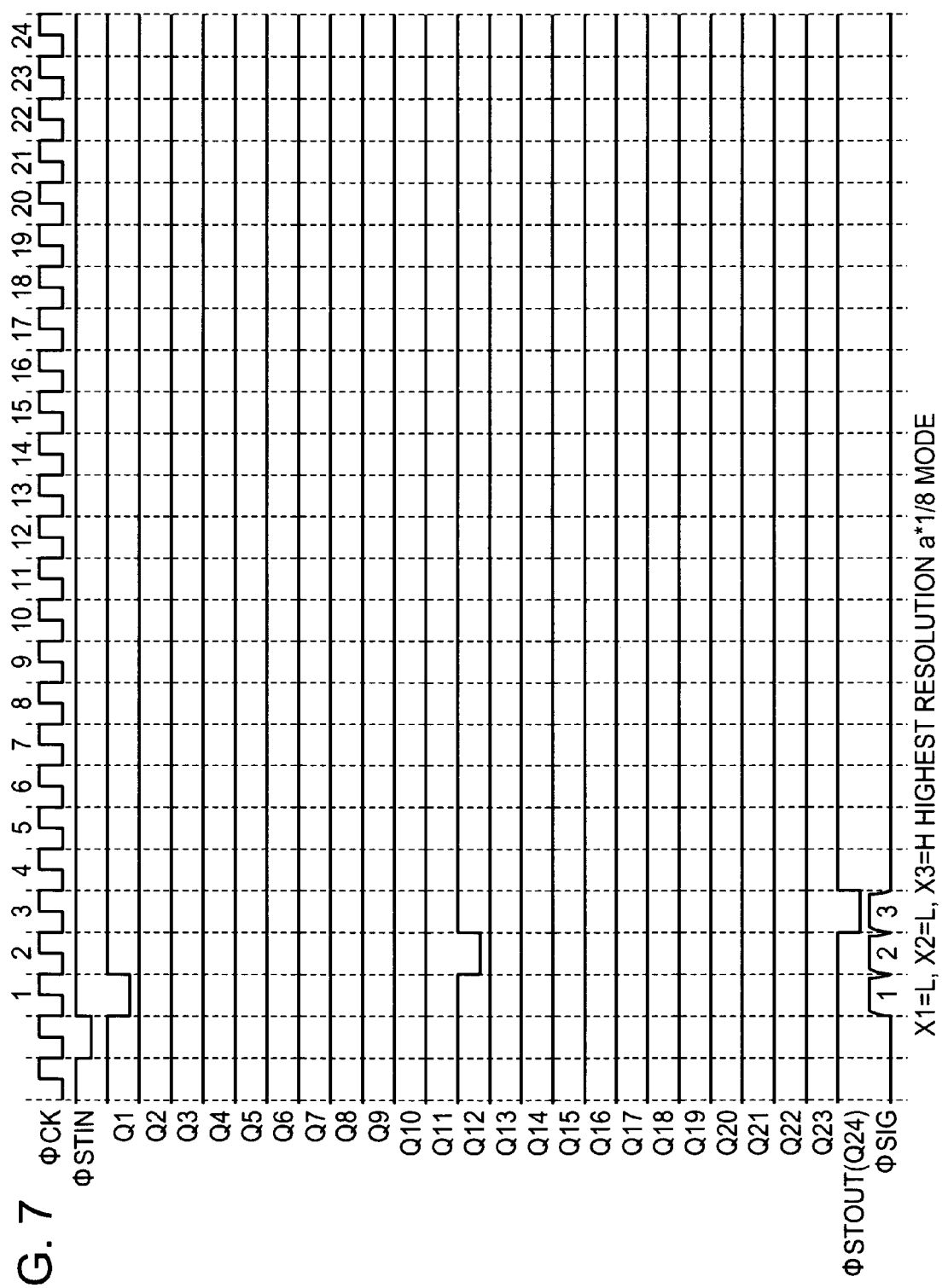
FIG. 7 is a time chart for when the resolution is the highest resolution a×⅛.
Figure 8:
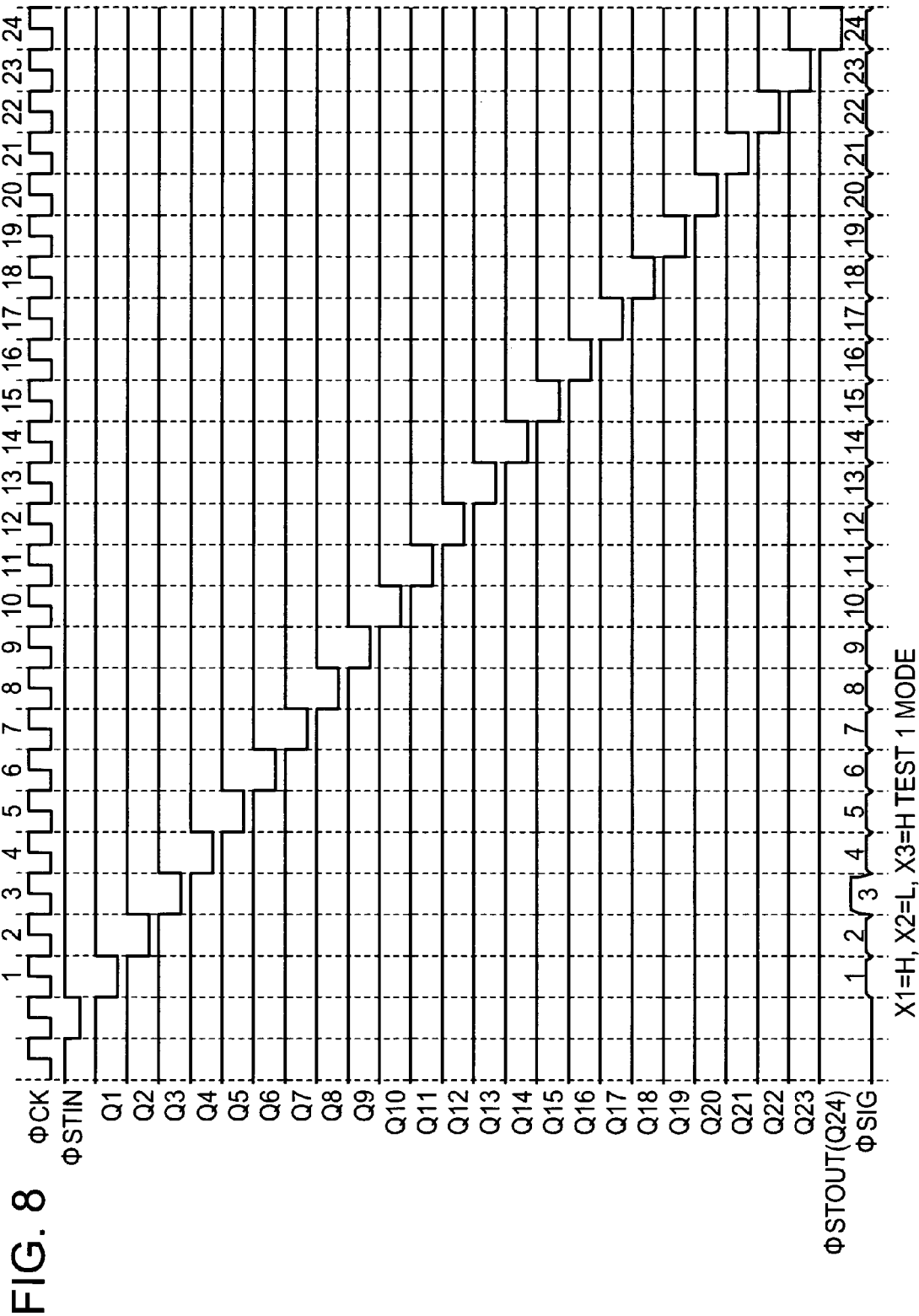
FIG. 8 is a time chart for a TEST 1 mode.
Figure 9:
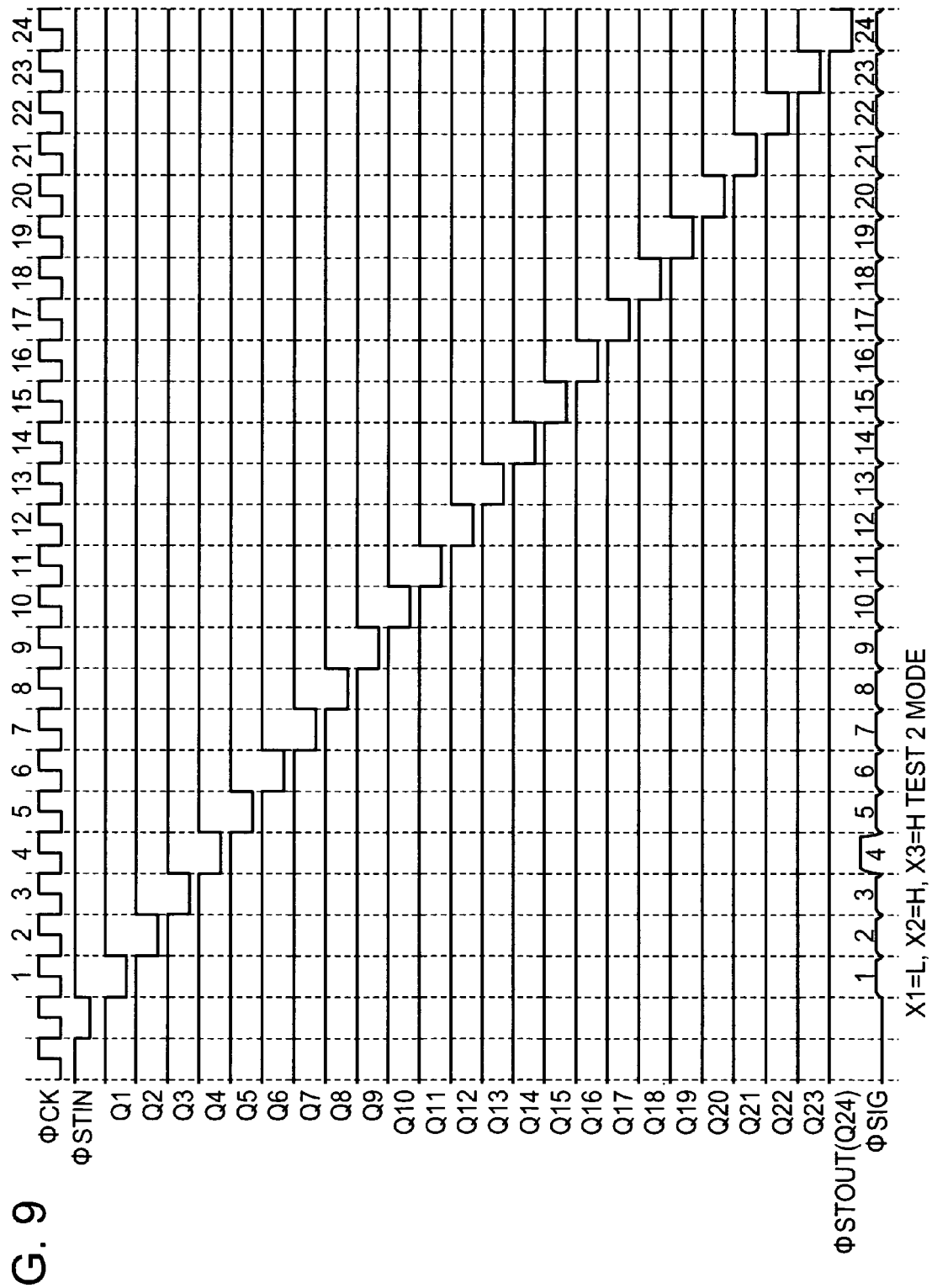
FIG. 9 is a time chart for a TEST 2 mode.
Figure 10:
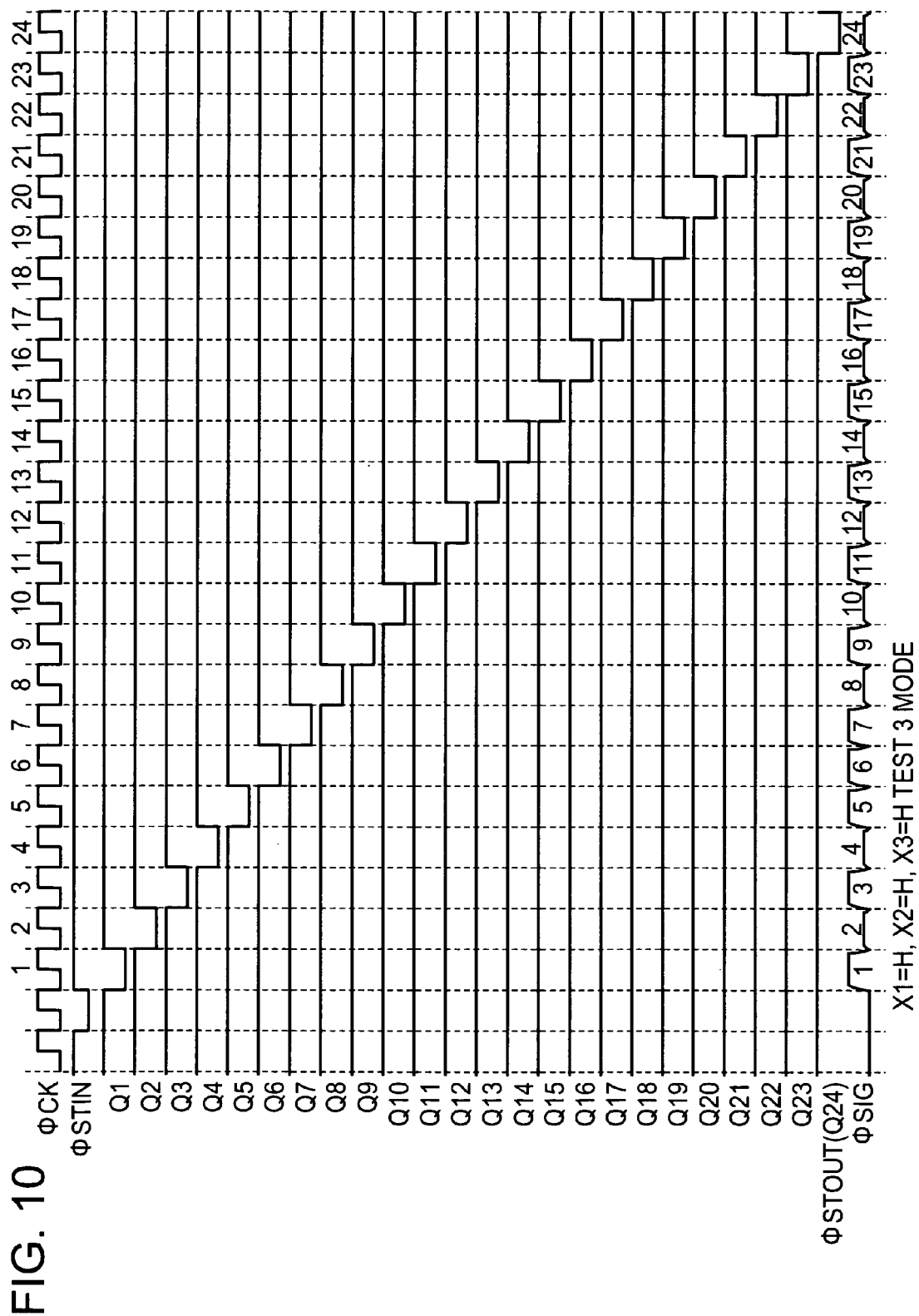
FIG. 10 is a time chart for a TEST 3 mode.
Figure 11:
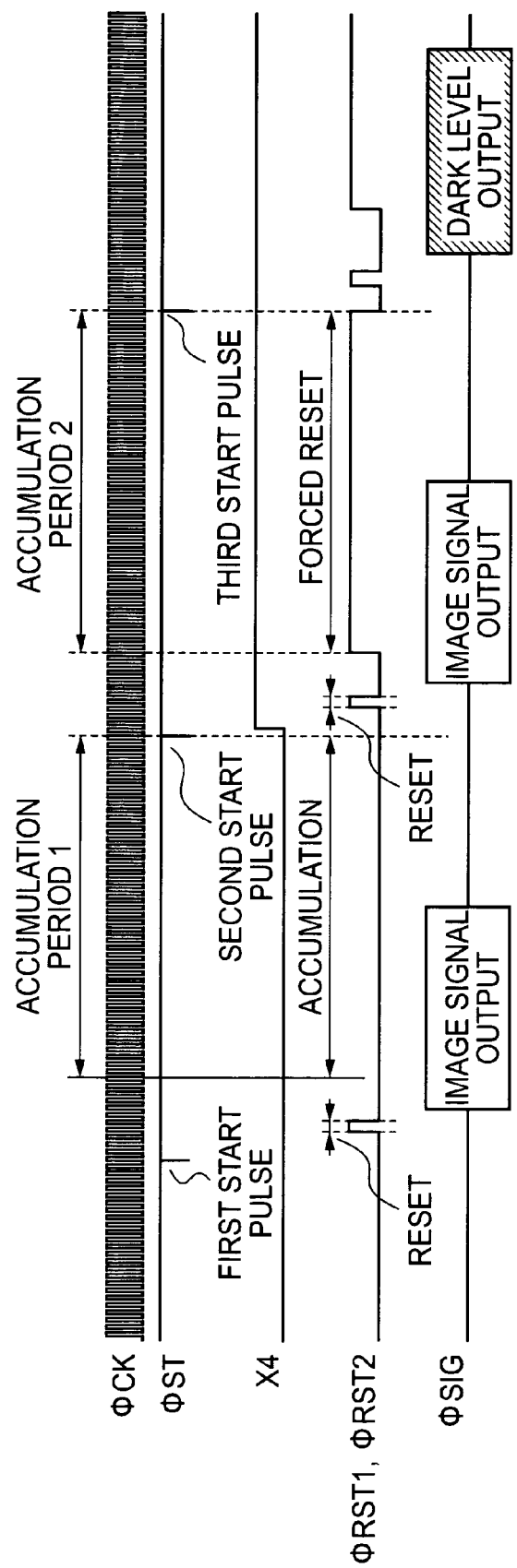
FIG. 11 is a time chart for an initialization potential output mode.
Figure 12:
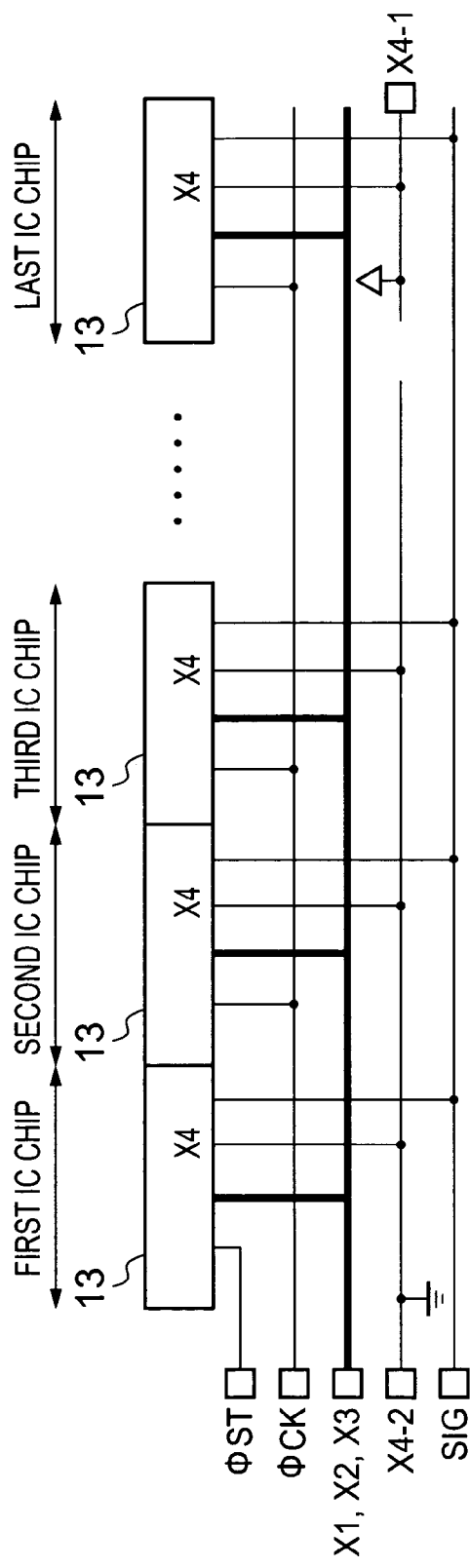
FIG. 12 is a block diagram of a contact image sensor unit in which the output of the last IC chip is dark level output.
Figure 13:
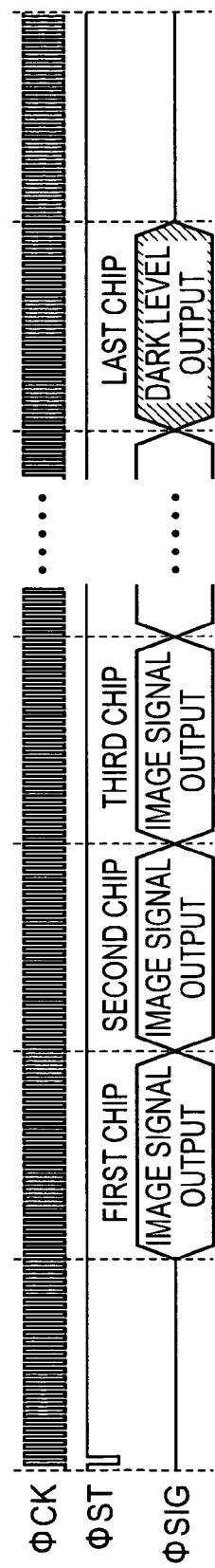
FIG. 13 is a time chart of the image sensor unit of FIG. 12.

FIG. 6 is a time chart for when the resolution is the highest resolution a×⅙. FIG. 7 is a time chart for when the resolution is the highest resolution a×⅛. FIG. 8 is a time chart for a TEST 1 mode. FIG. 9 is a time chart for a TEST 2 mode. FIG. 10 is a time chart for a TEST 3 Mode. FIG. 11 is a time chart for an initialization potential output mode in FIG. 23. FIG. 12 is a block diagram of a contact image sensor unit in which the output of the last IC chip is dark level output. FIG. 13 is a time chart of the image sensor unit of FIG. 12.

Figure 14:
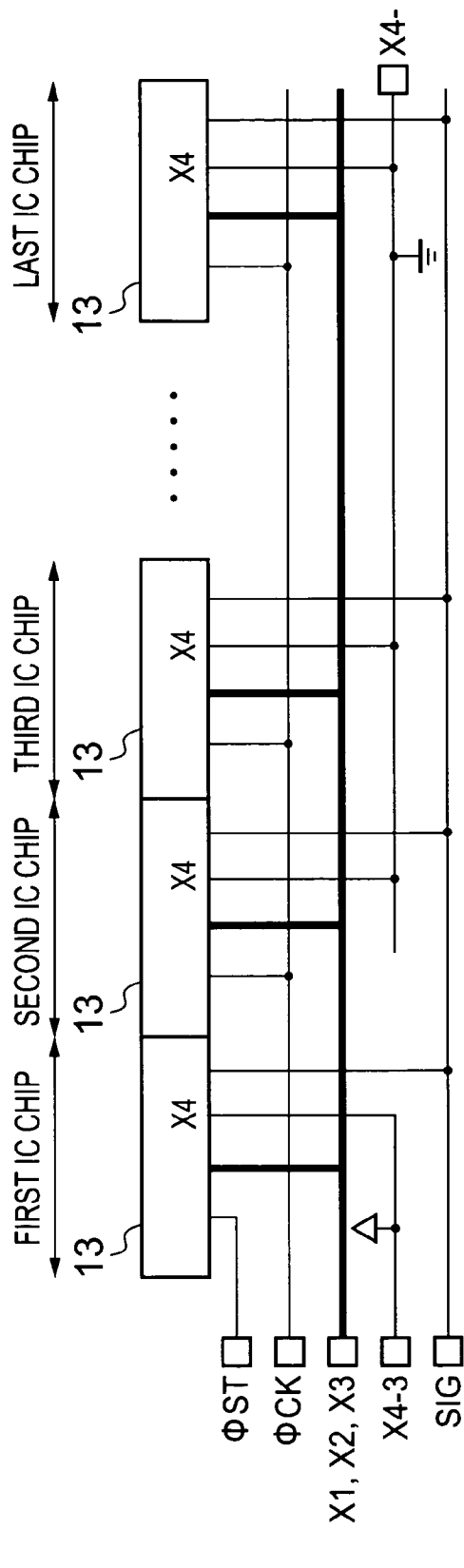
FIG. 14 is a block diagram of a contact image sensor unit in which the output of the first IC chip is dark level output.
Figure 15:
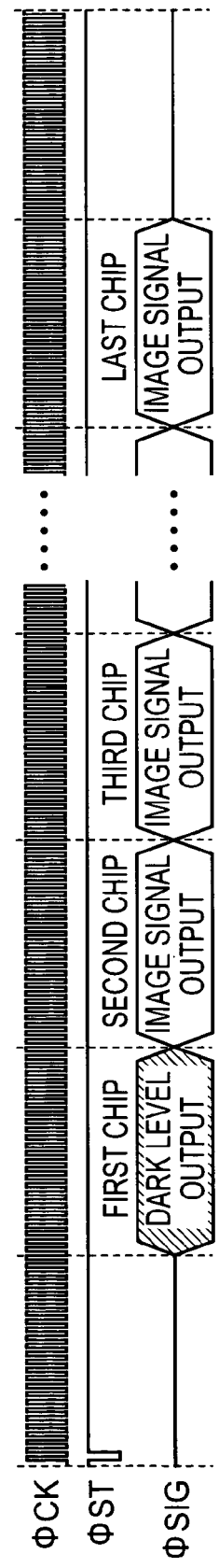
FIG. 15 is a time chart of the image sensor unit of FIG. 14.

FIG. 14 is a block diagram of a contact image sensor unit in which the output of the first IC chip is dark level output. FIG. 15 is a time chart of the image sensor unit of FIG. 14.

Figure 16:
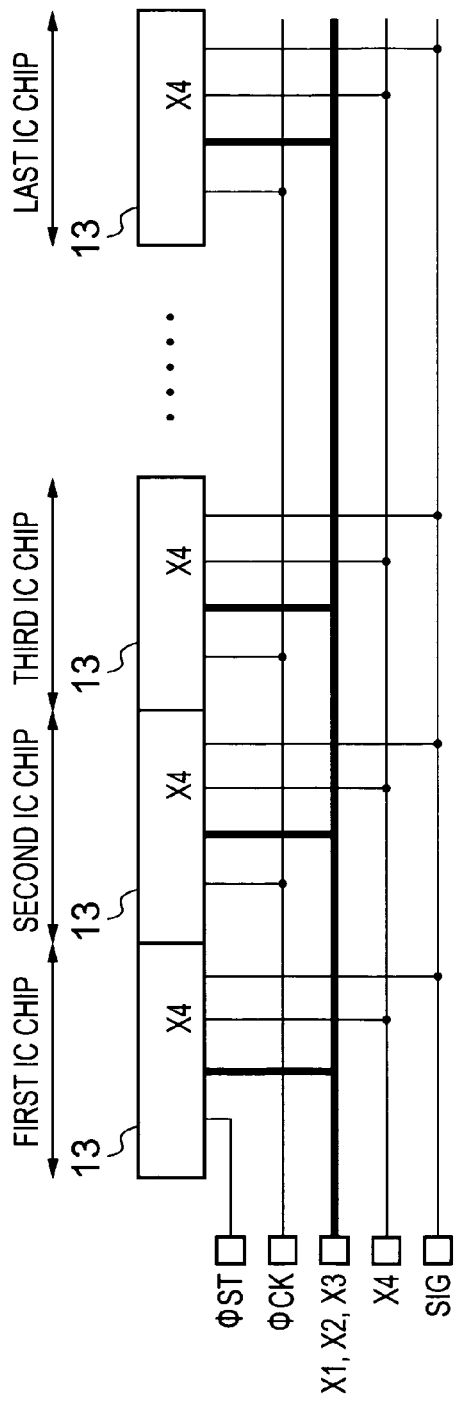
FIG. 16 is a block diagram of a contact image sensor unit in which the output of any arbitrary sensor IC chip could be dark level output.
Figure 17:
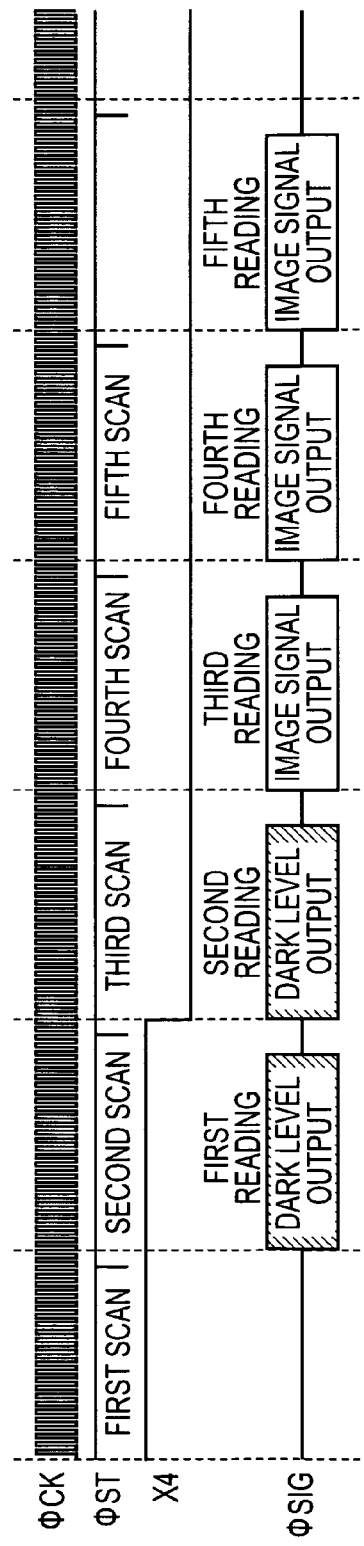
FIG. 17 is a time chart of the image sensor unit of FIG. 16.

FIG. 16 is a block diagram of a contact. image sensor unit in which the output of any arbitrary sensor IC chip could be dark level output. FIG. 17 is a time chart of the image sensor unit of FIG. 16.

Figure 18:
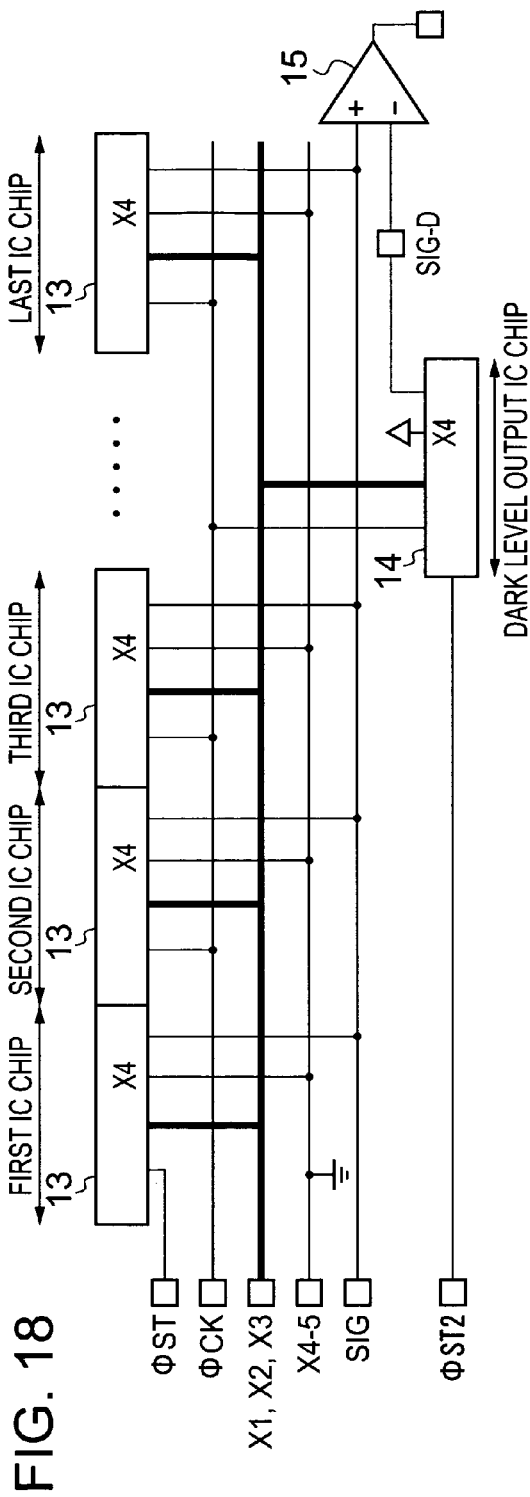
FIG. 18 is a block diagram of a contact image sensor unit in which the output of any arbitrary sensor IC chip could be dark level output.
Figure 19:
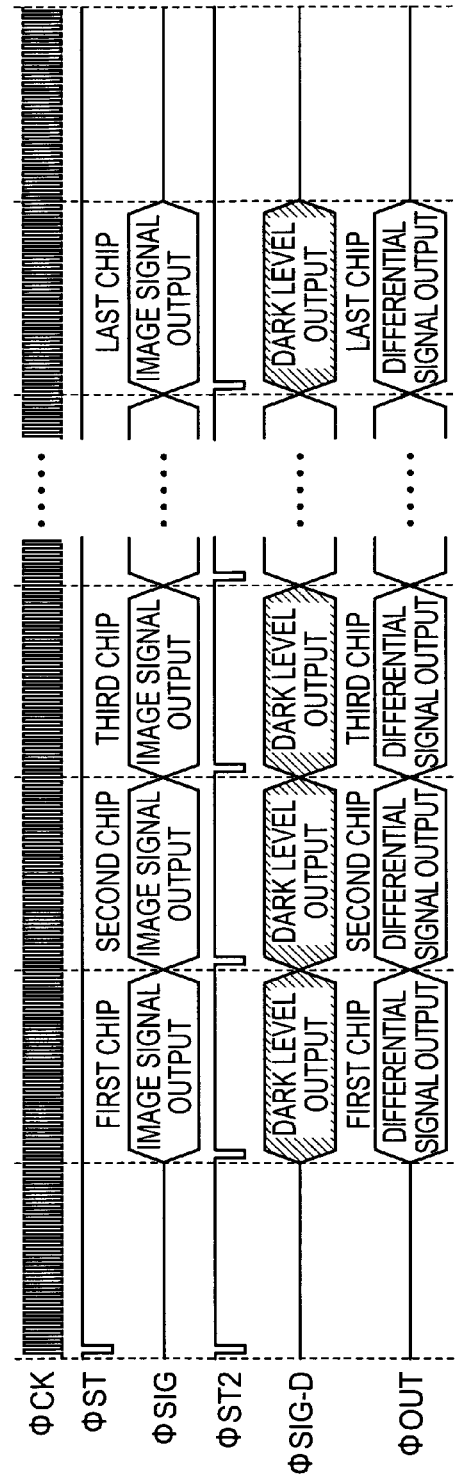
FIG. 19 is a time chart of the image sensor unit of FIG. 18.
Figure 20:
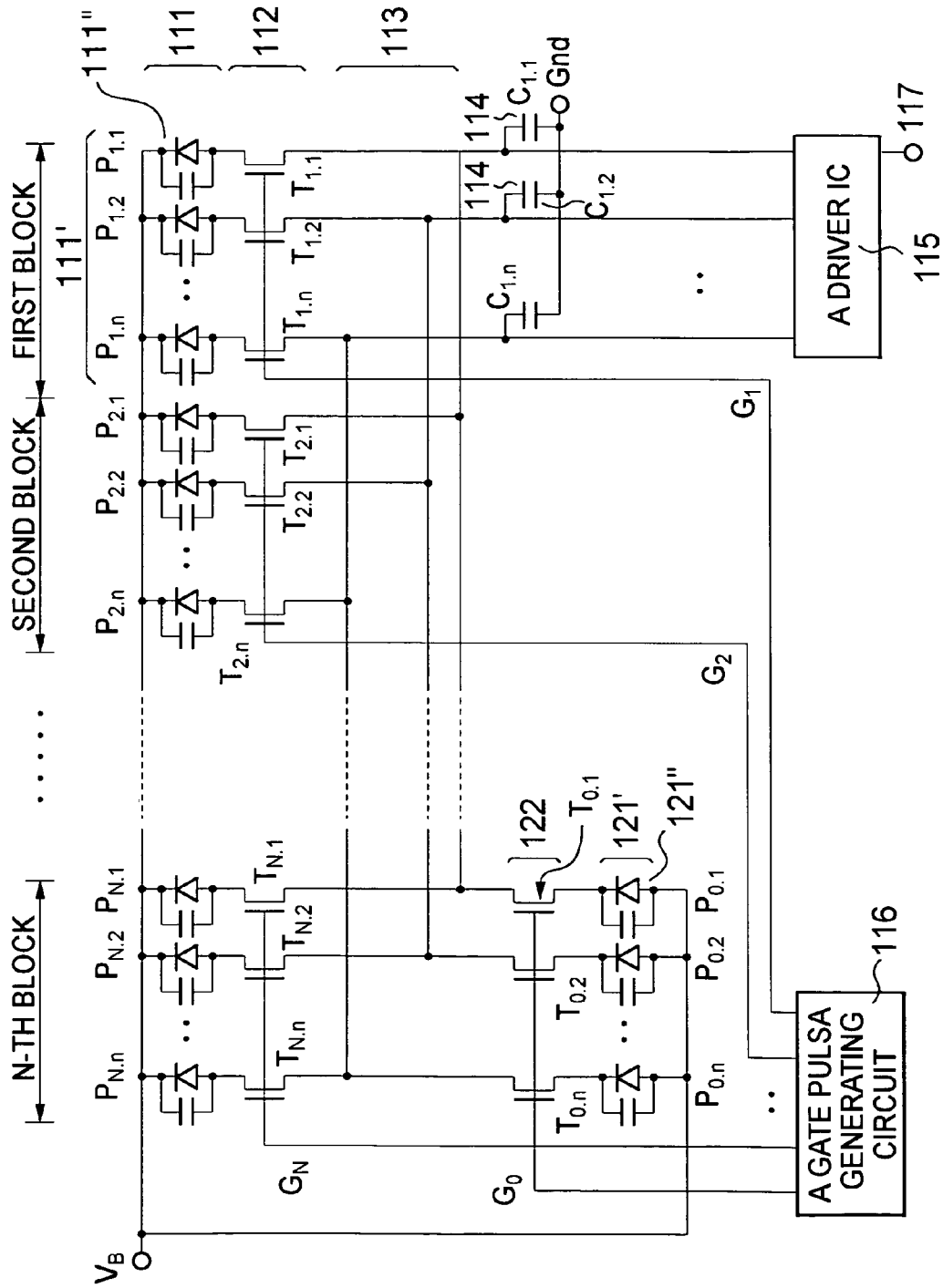
FIG. 20 is a circuit diagram of prior art.

FIG. 18 is a block diagram of a contact image sensor unit which utilizes a differential between an image signal output. IC chip and a dark level output IC chip. FIG. 19 is a time chart of the image sensor unit of FIG. 18.

In FIG. 1, light receiving device reset circuit device blocks 1-1, 1-2, . . . , 1-$m$ constitute a light receiving device reset circuit array 1. Light receiving device blocks 2-1, 2-2, . . . , 2-$m$ constitute a light receiving device array 2. Blocks 3-1, 3-2, . . . , 3-$m$ of switch devices between light receiving devices constitute an array 3 of switch devices between light receiving devices. Amplifier 1 circuit blocks 4-1, 4-2, . . . , 4-$m$ constitute an amplifier 1 circuit array 4. Sample & hold circuit blocks 5-1, 5-2, . . . , 5-$m$ constitute a sample & hold circuit array 5. Amplifier 2 circuit blocks 6-1, 6-2, . . . , 6-$m$ constitute an amplifier 2 circuit array 6. Reading switch device blocks 7-1, 7-2, . . . , 7-$m$ constitute a reading switch device array 7.

A common signal line is denoted by 8. Scanning circuit blocks 9-1, 9-2, . . . , 9-$m$ constitute a scanning circuit array 9. A dummy switch 10 has a gate and one of output terminals set to GND electric potential to be normally kept turned off. The other output terminal of the dummy switch 10 is connected to an input terminal SWIN of the block 3-1 of switch devices between light receiving devices, so that the load capacitance level of an output terminal of the first light receiving device in the light receiving device block 2-1 matches the load capacitance level of output terminals of the rest of the light receiving devices. In this way, fixed pattern noise between blocks is eliminated and uniform characteristics can be obtained.

Denoted by 11 is a resolution and TEST mode switching control circuit. Using input signals X1, X2 and X3, the switching control circuit 11 arbitrarily generates a control signal SWCTL, which is for controlling switches between light receiving devices, and a control signal SRCTL, which indicates the order of skipping in reading by scanning circuits.

Denoted by 12 is an initialization potential output/reset control circuit. By combining an initialization potential control signal X4 with the resolution switching control signals X1, X2 and X3, the control circuit 12 arbitrary controls the light receiving device reset control circuit array 1 to switch between normal operation of light receiving devices and constant initialization of light receiving devices which lasts throughout an accumulation period.

A reset voltage VRESET for initializing light receiving devices, and a reset 1 (ΦRST1) and reset 2 (ΦRST2) for controlling reset devices are connected to the light receiving device reset circuit array 1. The light receiving device reset circuit array 1 shares the reset voltage and the resets 1 and 2 with the initialization potential output/reset control circuit 12.

A bus line for the control signal (SWCTL) of switch devices between light receiving devices is connected to the array 3 of switch devices between light receiving devices.

A common signal line (SIG) for reading signals of light receiving devices is connected in a shared manner to the reading switch device array 7.

A clock (ΦCK) for driving scanning circuits is connected to the scanning circuit array 9 and shared between the scanning circuit blocks. Also connected to the scanning circuit array 9 are a start pulse (ΦST) and a bus line for the control signal (SRCTL) that is used to control the order of reading by scanning circuits.

FIG. 2 shows circuits for 24 bits in the n-th blocks out of the first, second, . . . and m-th device blocks and circuit blocks. In the light receiving device reset circuit device block 1-$n$, one terminal of each odd-numbered light receiving device reset switch device (1-$n$-1, 1-$n$-3, 1-$n$-5, . . . , 1-$n$-23) is given the reset voltage VRESET and is controlled with ΦRST1 whereas one terminal of each even-numbered light receiving device reset switch device (1-$n$-2, 1-$n$-4, 1-$n$-6, . . . , 1-$n$-24) is given the reset voltage VRESET and is controlled with ΦRST2. Output terminals of photodiodes in the light receiving device block 2-$n$ (photodiodes 2-$n$-1, . . . , 2-$n$-24) are connected to the reset switch devices (1-$n$-1, . . . , 1-$n$-24), respectively.

In the block 3-$n$ of switch devices between light receiving devices, switches (3-$n$-1, 3-$n$-2, . . . , 3-$n$-23) between light receiving devices are each connected to output terminals of adjacent light receiving devices, and are controlled separately through the bus line for the control signal (SWCTL). An SWIN terminal is a terminal for connecting with the preceding block of switch devices between light receiving devices or with the dummy switch 10 in FIG. 1. An SWOUT terminal is a terminal for connecting with the subsequent block of switch devices between light receiving devices or with GND electric potential in FIG. 1.

The amplifier 1 circuit block 4-*n* has amplifiers 1 (4-*n*-1, ..., 4-*n*-24) for accumulating, temporarily, in sample & hold circuits (5-*n*1, ..., 5-*n*-24) of the sample & hold circuit block 5-*n*, electric charges outputted from the light receiving devices (2-*n*-1, ..., 2-*n*-24).

Amplifiers 2 (6-*n*-1, ..., 6-*n*-24) of the amplifier 2 circuit block 6-*n* are connected to switch devices (7-*n*-1, ..., 7-*n*-24) of the reading switch device block 7-*n*. When a start pulse ΦSTIN is inputted and the resolution is set to the highest level, outputs Q1, ..., Q24 of the scanning circuit block 9-*n* controlled through the bus line for SRCTL turn on the switch devices (7-*n*-1, ..., 7-*n*-24) of the switch device block 7-*n* one by one in sync with clock signals (ΦCK), so that the electric charges which have temporarily been accumulated in the sample & hold circuits (5-*n*-1, ..., 5-*n*-24) are read and sent to the common signal line 8. When the resolution is lower than the highest level, the outputs of the scanning circuit block are arbitrarily skipped and the electric charges accumulated in the sample & hold circuits are read accordingly.

FIG. 21 shows the settings of switches between light receiving devices in FIG. 2 at the respective resolution levels.

In FIG. 21, the signal X4 is set to Lo level. The reset voltage VRESET for initializing light receiving devices and the reset 1 (ΦRST1) and the reset 2 (ΦRST2) for controlling reset devices are set to normal operation.

When the signals X1, X2 and X3 are Lo level, the resolution is set to the highest level (highest resolution a) turning off every switch between light receiving devices. As a result, electric charges outputted from the light receiving devices (2-*n*-1, 2-*n*-24) are accumulated in the sample & hold circuits (5-*n*-1, 5-*n*-24), respectively. FIG. 3 is a time chart for when the resolution is the highest resolution a. As a start pulse ΦSTIN is inputted, the outputs (Q1, ..., Q24) of the scanning circuits turn on the reading switch devices (7-*n*-1, ..., 7-*n*-24) one by one in sync with clock signals (ΦCK) to read the electric charges accumulated in the sample & hold circuits (5-*n*-1, ..., 5-*n*-24). The electric charges read are sent to the common signal line 8 (SIG).

When the signal X1 is Hi level whereas the signals X2 and X3 are Lo level, the resolution is half the highest resolution a (highest resolution a×½) and the odd-numbered switches (3-*n*-1, 3-*n*-3, 3-*n*-23) between light receiving devices are turned on while the even-numbered switches (3-*n*-2, 3-*n*-4, ..., 3-*n*-24) between light receiving devices are turned off, thereby interconnecting outputs of two adjacent light receiving devices. The amount of photoelectric charges of the light receiving devices which is determined by the amount of light received is doubled, but the increase is canceled by the also-doubled junction capacitance. The average of the outputs of the light receiving devices is accumulated in the form of electric charges in two adjacent sample & hold circuits. FIG. 4 is a time chart for when the resolution is the highest resolution a×½. As a start pulse ΦSTIN is inputted, the outputs Q1, Q4, Q5, Q8, Q9, Q12, Q13, Q16, Q17, Q21, Q22, Q24 of the scanning circuits turn on the reading switch devices (7-*n*-1, 7-*n*-4, 7-*n*-5, 7-*n*-8, 7-*n*-9, 7-*n*-12, 7-*n*-13, 7-*n*-14, 7-*n*-16, 7-*n*-19, 7-*n*-21, 7-*n*-22, 7-*n*-24) one by one in the order stated in sync with clock signals (ΦCK) to read the electric charges accumulated in the sample & hold circuits (5-*n*-1, 5-*n*-4, 5-*n*-5, 5-*n*-8, 5-*n*-9, 5-*n*-12, 5-*n*-13, 5-*n*-14, 5-*n*-16, 5-*n*-19, 5-*n*-21, 5-*n*-22, 5-*n*-24). The electric charges read are sent to the common signal line 8 (SIG.).

When the signal X1 is Hi level, the signal X2 is Hi level, and the signal X3 is Lo level, the resolution is one-fourth of the highest resolution a (highest resolution a×¼) and any switch between light receiving devices whose stage number corresponds to a multiple of 4 is turned off (the switches 3-*n*-4, 3-*n*-8, 3-*n*-12, 3-*n*-16, 3-*n*-20, 3-*n*-23) while the other switches between light receiving devices are turned on, thereby interconnecting outputs of four adjacent light receiving devices. The amount of photoelectric charges of the light receiving devices which is determined by the amount of light received is quadrupled, but the increase is canceled by the also-quadrupled junction capacitance. The average of the outputs of the light receiving devices is accumulated in the form of electric charges in four adjacent sample & hold circuits. FIG. 5 is a time chart for when the resolution is the highest resolution a×¼. As a start pulse ΦSTIN is inputted, the outputs Q1, Q8, Q9, Q16, Q17, Q24 of the scanning circuits turn on the reading switch devices (7-*n*-1, 7-*n*-8, 7-*n*-9, 7-*n*-16, 7-*n*-19, 7-*n*-24) one by one in the order stated in sync with clock signals (ΦCK) to read the electric charges accumulated in the sample & hold circuits (5-*n*-1, 5-*n*-8, 5-*n*-9, 5-*n*-16, 5-*n*-19, 5-*n*-24). The electric charges read are sent to the common signal line 8 (SIG).

When the signal X1 and the signal X2 are Hi level whereas the signal X3 is Lo level, the resolution is one-sixth of the highest resolution a (highest resolution a×⅙) and any switch between light receiving devices whose stage number corresponds to a multiple of 6 is turned off (the switches 3-*n*-6, 3-*n*-12, 3-*n*-18, 3-*n*-24) while the other switches between light receiving devices are turned on, thereby interconnecting outputs of six adjacent light receiving devices. The amount of photoelectric charges of the light receiving devices which is determined by the amount of light received is multiplied by six, but the increase is canceled by the junction capacitance also multiplied by six. The average of the outputs of the light receiving devices is accumulated in the form of electric charges in six adjacent sample & hold circuits. FIG. 6 is a time chart for when the resolution is the highest resolution a×⅙.

As a start pulse ΦSTIN is inputted, the outputs Q1, Q8, Q17, Q24 of the scanning circuits turn on the reading switch devices (7-*n*-1, 7-*n*-8, 7-*n*-17, 7-*n*-24) one by one in the order stated in sync with clock signals (ΦCK) to read the electric charges accumulated in the sample & hold circuits (5-*n*-1, 5-*n*-8-, 5-*n*-17, 5-*n*-24). The electric charges read are sent to the common signal line 8 (SIG).

When the signal X1 is Lo level, the signal X2 is Lo level, and the signal X3 is Hi level, the resolution is one-eighth of the highest resolution a (highest resolution a×⅛) and any switch between light receiving devices whose stage number corresponds to a multiple of 8 is turned off (the switches 3-*n*-8, 3-*n*-16, 3-*n*-24 are turned off) whereas the rest of the switches between light receiving devices are turned on, thereby interconnecting outputs of eight adjacent light receiving devices. The amount of photoelectric charges of the light receiving devices which is determined by the amount of light received is multiplied by eight, but the increase is canceled by the junction capacitance which is also increased eight times. The average of the outputs of the light receiving devices is accumulated in the form of electric charges in eight adjacent sample & hold circuits.

FIG. 7 is a time chart for when the resolution is the highest resolution a×⅛. As a start pulse ΦSTIN is inputted, the outputs Q1, Q12, Q24 of the scanning circuits turn on the reading switch devices (7-*n*-1, 7-*n*-12, 7-*n*-24) one by one in the order stated in sync with clock signals (ΦCK) to read the electric charges accumulated in the sample & hold circuits (5-*n*-1, 5-*n*-12, 5-*n*-24). The electric charges read are sent to the common signal line 8 (SIG).

At any level of resolution, the switch 3-*n*-24 between light receiving devices is turned off, and one output terminal SWOUT of the block 3-*m* of switch devices between light receiving devices in FIG. 1 is connected to GND, so that the load capacitance level of an output terminal of the last light receiving device in the light receiving device block 2-*m* matches the load capacitance level of output terminals of the rest of the light receiving devices. In this way, fixed pattern noise between blocks is eliminated and uniform characteristics can be obtained.

FIG. 22 shows the settings for testing the function of the switch devices between the light receiving devices, in FIG. 2. In FIG. 22, the signal X4 is set to Lo level. The reset voltage VRESET for initializing light receiving devices and the reset 1 (ΦRST1) and reset 2 (ΦRST2) for controlling reset devices are set to normal operation.

When the signal X1 is Hi level, the signal X2 is Lo level, and the signal X3 is Hi level, the mode is set to a TEST 1 mode and the even-numbered switches (3-*n*-2, 3-*n*-4, . . . , 3-*n*-24) between light receiving devices are turned on whereas the odd-numbered switches (3-*n*-1, 3-*n*-3, . . . , 3-*n*-23) between light receivingdevices are turned off, thereby interconnecting outputs of two adjacent light receiving devices. This puts ΦRST2 in a constantly Hi level state and the even-numbered light receiving devices (2-*n*-2, 2-*n*-4, . . . , 2-*n*-24) are always given the initialization voltage VRESET.

In a test where every light receiving device is irradiated with light, if even-numbered switches between light receiving devices are functioning normally, every light receiving device is initialized and outputs the dark level. On the other hand, if the switches are malfunctioning, odd-numbered light receiving devices output electric charges in an amount corresponding to the amount of light received and thus a malfunction can be detected. FIG. 8 is a time chart for the TEST 1 mode. Similar to when the resolution is set to the highest resolution a, input of a start pulse ΦSTIN causes the outputs Q1, . . . , Q24 of the scanning circuits to turn on the reading switch devices (7-*n*-1, . . . , 7-*n*-24) one by one in sync with clock signals (ΦCK). .As a result, the electric charges accumulated in the sample & hold circuits (5-*n*-1, . . . , 5-*n*-24) are read out and sent to the common signal line 8 (SIG). Shown here is an example in which the switch 3-*n*-2 between light-receiving devices is malfunctioning making the output of the third light receiving device high.

Next, when the signal X1 and the signal X2 are Hi level and the signal X3 is Lo level, the mode is set to a TEST 2 mode and the even-numbered switches (3-*n*-2, 3-*n*-4, . . . , 3-*n*-24) between light receiving devices are turned on whereas the odd-numbered switches (3-*n*-1, 3-*n*-3, . . . , 3-*n*-23) between light receiving devices are turned off, thereby interconnecting outputs of two adjacent light. receiving devices. This puts ΦRST2 in a constantly Hi level state and the odd-numbered light receiving devices (2-*n*-1, 2-*n*-3, . . . , 2-*n*-23) are always given the initialization voltage VRESET.

In a test where every light receiving device is irradiated with light, if odd-numbered switches between light receiving devices are functioning normally, every light receiving device is initialized and outputs the dark level. On the other hand, if the switches are malfunctioning, even-numbered light receiving devices output electric charges in an amount corresponding to the amount of light received and thus a malfunction can be detected. FIG. 9 is a time chart for the TEST 2 mode. Similar to the case where the resolution is set to the highest resolution a, input of a start pulse ΦSTIN causes the outputs Q1, . . . , Q24 of the scanning circuits to turn on the reading switch devices (7-*n*-1, . . . , 7-*n*-24) one by one in sync with clock signals (ΦCK). As a result, the electric charges accumulated in the sample & hold circuits (5-*n*-1, . . . , 5-*n*-24) are read out and sent to the common signal line 8 (SIG). Shown here is an example in which the switch 3-*n*-3 between light receiving devices is malfunctioning making the output of the fourth light receiving device high.

When the signal X1 is Hi level, the signal X2 is Hi level, and the signal X3 is Hi level, the mode is set to a TEST 3 mode and all the switches (3-*n*-1, . . . , 3-*n*-24) between light receiving devices are turned off. This puts ΦRST2 in a constantly Hi level state and the even-numbered light receiving devices (2-*n*-2, 2-*n*-4, . . . , 2-*n*-24) are always given the initialization voltage VRESET. In a test where every light receiving device is irradiated with light, if the switches between light receiving devices are functioning normally, even-numbered light receiving devices are initialized and output the dark level whereas odd-numbered light receiving devices output electric charges in an amount corresponding to the amount of light received. On the other hand, if the switches are malfunctioning, even-numbered light receiving devices output electric charges in an amount corresponding to the amount of light received and thus a malfunction can be detected.

FIG. 10 is a time chart for the TEST 3 mode. Similar to the case in which the resolution is set to the highest resolution a, input of a start pulse ΦSTIN causes the outputs Q1, . . . , Q24 of the scanning circuits to turn on the reading switch devices (7-*n*-1, . . . , 7-*n*-24) one by one in sync with clock signals (ΦCK). As a result, the electric charges accumulated in the sample & hold circuits (5-*n*-1, . . . , 5-*n*-24) are read out and sent to the common signal line 8 (SIG). Shown here is an example in which the switch 3-*n*-6 between light receiving devices is malfunctioning making the output of the sixth light receiving device high.

FIG. 23 shows the settings for outputting initialization potential of the light receiving devices in FIG. 2. When the signal X4 is Hi level, the reset voltage VRESET for initializing light receiving devices and the reset 1 (ΦRST1) and reset 2 (ΦRST2) for controlling reset devices are set to Hi during an accumulation period. When the signals X1, X2 and X3 are Lo level, the resolution is set to the highest resolution a. When the signal X1 is Hi level whereas the signals X2 and X3 are Lo level, the resolution is set to the highest resolution a×½. When the signal X1 is Lo level, the signal X2 is Hi level, and the signal X3 is Lo level, the resolution is set to the highest resolution a×¼. When the signal X1 is Hi level, the signal X2 is Hi level, and the signal X3 is Lo level, the resolution is set to the highest resolution a×⅙. When the signal X1 is Lo level, the signal X2 is Lo level, and the signal X3 is Hi level, the resolution is set to the highest resolution a×⅛.

FIG. 11 is a time chart for an initialization potential output mode in FIG. 23. In FIG. 11, a clock signal ΦCK and a start pulse ΦST are inputted to start driving the light receiving devices, which are reset to the initial electric potential by the reset signals ΦRST1 and ΦRST2 for controlling the reset devices and are controlled with the initialization potential control signal X4.

In an accumulation period 1, the initialization potential control signal X4 is Lo level. After a first start pulse ΦST is inputted, the reset signals ΦRST1 and ΦRST2 in FIG. 1 are generated to apply a reset voltage for initializing light receiving devices to the light receiving device reset circuit array 1. The light receiving device array 2 is initialized to have a desired voltage. Thereafter, electric charges are accumulated until a second start pulse ΦST is inputted, and normal image signal outputs are read in accordance with the respective resolution levels.

In an accumulation period 2, the initialization potential control signal X4 is Hi level. After the second start pulse ΦST is inputted, the reset signals ΦRST1 and ΦRST2 in FIG. 1 are generated to apply a reset voltage for initializing light receiving devices to the light receiving device reset circuit array 1. The light receiving device array 2 is initialized to have a desired voltage. Thereafter, the reset signals are again inputted to start a forced reset state in which the light receiving devices are kept initialized even when irradiated with light. The light receiving devices therefore output dark level in accordance with the respective resolution levels. The forced reset state lasts until a third start pulse ΦST is inputted.

FIG. 12 is a block diagram of a contact image sensor unit in which the output of the last IC chip is dark level output, and FIG. 13 is a time chart of the image sensor unit of FIG. 12.

In FIG. 12, sensor IC chips each of which is denoted by 13 constitute a multi-chip type image sensor unit. A clock (ΦCK) for driving the sensor IC chips is connected to and shared between the sensor IC chips. A start pulse (ΦST) is connected to the first IC chip. A bus line for input signals X1, X2 and X3 of a resolution and TEST mode switching control circuit is connected to and shared between all of the sensor IC chips. An input terminal X4-1 of a reset control circuit is connected to a terminal X4 of-the last IC chip, and is connected to a power supply voltage Vdd. An input terminal X4-2 of the reset control circuit is connected in a shared manner to other IC chips, and is connected to GND. A signal terminal (SIG) for reading signals from light receiving devices is connected to and shared between the sensor IC chips. The operation of the image sensor unit structured as shown in FIG. 12 is described with reference to FIG. 13. Note that every sensor IC chip is irradiated with light of uniform brightness and repeats accumulation operation, reset, and reading operation.

As clock signals (ΦCK) for driving all the sensor IC chips are inputted and a start pulse (ΦST) is inputted to the first IC chip, image signals are outputted in sync with the clock signals (ΦCK) from all the IC chips, except the last IC chip, in order starting from the first IC chip and ending with the second from the last IC chip. Even if the last IC chip alone is irradiated with light, its light receiving devices are kept initialized and therefore always output the dark level.

FIG. 14 is a block diagram of a contact image sensor unit in which the output of the first IC chip is dark level output, and FIG. 15 is a time chart of the image sensor unit of FIG. 14.

In FIG. 14, sensor IC chips each of which is denoted by 13 constitute a multi-chip type image sensor unit. A clock (ΦCK) for driving the sensor IC chips is connected to and shared between the sensor IC chips. A start pulse (ΦST) is connected to the first IC chip. A bus line for input signals X1, X2 and X3 of a resolution and TEST mode switching control circuit is connected to and shared between all of the sensor IC chips. An input terminal X4-3 of a reset control circuit is connected to a terminal X4 of the first IC chip, and is connected to a power supply voltage Vdd. An input terminal X4-4 of the reset control circuit is connected in a shared manner to other IC chips, and is connected to GND. A signal terminal (SIG) for reading signals from light receiving devices is connected to and shared. between the sensor IC chips. The operation of the image sensor unit structured as shown in FIG. 14 is described with reference to FIG. 15. Note that every sensor IC chip is irradiated with light of uniform brightness and repeats accumulation operation, reset, and reading operation.

As clock signals (ΦCK) for driving all the sensor IC chips are inputted and a start pulse (ΦST) is inputted to the first IC chip, image signals are outputted in sync with the clock signals (ΦCK) from all the IC chips, except the first IC chip, in order starting from the second IC chip and ending with the last IC chip. Even if the first IC chip alone is irradiated with light, its light receiving devices are kept initialized and therefore always output the dark level.

FIG. 16 is a block diagram of a contact image sensor unit in which the output of any arbitrary sensor IC chip could be dark level output, and FIG. 17 is a time chart of the image sensor unit of FIG. 16.

In FIG. 16, plural sensor IC chips each of which is denoted by 13 constitute a multi-chip type image sensor unit. A clock (ΦCK) for driving the sensor IC chips is connected to and shared between the sensor IC chips. A start pulse (ΦST) is connected to the first IC chip. A bus line for input terminals X1, X2 and X3 of a resolution and TEST mode switching control circuit is connected to and shared between all of the sensor IC chips. An input terminal X4 of a reset control circuit is connected to and shared between all the sensor IC chips as an external input terminal. A signal terminal (SIG) for reading signals from light receiving devices is connected to and shared between the sensor IC chips. The operation of the image sensor unit structured as shown in FIG. 16 is described with reference to FIG. 17. Note that every sensor IC chip is irradiated with light of uniform brightness and repeats accumulation operation, reset, and reading operation.

Clock signals (ΦCK) for driving all the sensor IC chips are inputted and a start pulse (ΦST) is inputted to the first IC chip to start the first scan. In the first scan and the second scan, when a Hi level signal is inputted to the input terminal X4 of the reset control circuit, the light receiving devices are kept initialized even when irradiated with light. From the third scan to the fifth scan, input of a Lo level signal to the input terminal X4 of the reset control circuit starts an accumulation state in which the light receiving devices output electric charges in an amount corresponding to the amount of light received from irradiation. Through this operation, dark level is outputted in the first reading and the second reading in sync with clock signals (ΦCK) and image signals are outputted from the third reading to the fifth reading.

FIG. 18 is a block diagram of a contact image sensor unit which utilizes a differential between an image signal output IC chip and a dark level output IC chip, and FIG. 19 is a time chart of the image sensor unit of FIG. 18. In FIG. 18, plural sensor IC chips each of which is denoted by 13 constitute a multi-chip type image sensorunit. A clock (ΦCK) for driving the sensor IC chips 13, 13, . . . is connected to and shared between the sensor IC chips. A start pulse (ΦST) is connected to the first IC chip. A bus line for input terminals X1, X2 and X3 of a resolution and TEST mode switching control circuit is connected to each sensor IC chip 13 and shared between the sensor IC chips. An input terminal X4-5 of a reset control circuit is connected to every sensor IC chip 13 in a shared manner, and is connected to a power supply voltage GND. A signal terminal (SIG) for reading signals from light receiving devices is connected to and shared between the sensor IC chips. Denoted by 14 is a sensor IC chip of the image sensor that is provided to output the dark level. The sensor IC chip 14 is connected to the clock (ΦCK) in a shared manner in order to drive the sensor IC chip 14. A start pulse (ΦST2) is connected to the sensor IC chip 14. The bus line for the input signals X1, X2 and X3 of the resolution and TEST mode switching control circuit is connected to the sensor IC chip 14. A terminal X4 of a reset control circuit of the sensor IC chip 14 is connected to the power supply voltage VDD. A dark level signal terminal (SIG-D) for reading dark level signals of light receiving devices is connected to the sensor IC chip 14. The signal terminal (SIG) and the dark level signal terminal (SIG-D) are connected to an input terminal of a differential amplifier 15, and a differential between a signal component of a light receiving device and a dark level signal of a light receiving device is outputted to the external through an output terminal OUT.

The operation of the image sensor unit structured as shown in FIG. 18 is described with reference to FIG. 19. Note that every sensor IC chip is irradiated with light of uniform brightness and repeats accumulation operation, reset, and reading operation.

As clock signals (ΦCK) for driving all of the sensor IC chips 13, 13, . . . are inputted and a start pulse (ΦST) is inputted to the first IC chip, image signals are outputted in sync with the clock signals (ΦCK) from the IC chips 13, 13, . . . in order starting from the first IC chip and ending with the last IC chip. On the other hand, a start pulse (ΦST2) is inputted to the dark level output IC chip 14 each time a signal is read from one sensor IC chip 13. In other words, start pulses in a number corresponding to the number of the IC chips 13, 13, . . . are inputted in succession to the IC chip 14. The dark level output IC chip 14 outputs dark level in sync with the clock signals (ΦCK) and with the image signals outputted from the first IC chip 13 through the last IC chip 13. A differential between these two signal components is outputted from the differential amplifier.

In this way, plural resolution levels can be chosen through the control terminals X1, X2 and X3 and the image sensor is composed of m blocks of the same circuit as shown in FIG. 1. Multiple resolution levels can be chosen from between the highest resolution at which data is sequentially read by scanning every one of light receiving devices for 24×m bits with scanning circuits and the lowest resolution at which reading of some data is skipped by selectively turning on switches between light receiving devices for 24×m×⅛ bits and scanning the average of outputs of the light receiving devices with arbitrary scanning circuits. Also, the scanning speed can be increased by limiting information to the minimum amount needed. In addition, the dummy switch serves as a counter measure against fixed pattern noise. The image sensor can also improve the quality through the TEST modes. Furthermore, since the image sensor uses the same light receiving devices within ICs, the same sample & hold circuits, and the same common signal line in the initialization potential output mode, the dark level can be corrected with high precision while factoring in fixed pattern noise inherent to individual ICs due to a voltage drop that results from power supply line resistance unique to long ICs, switching noise, and temperature characteristics.

In this embodiment, the bias voltage of the light receiving devices is set to GND (0 V) for conveniences' sake, but may instead be set to VBIAS (intermediate electric potential) or VDD (power supply voltage). The switch devices between light receiving devices are NMOS transistors, but may instead be PMOS or CMOS (transmission gate) transistors. The reset devices for initializing light receiving devices are NMOS transistors, but PMOS transistors may be employed instead.

The image sensor of this embodiment is structured to present eight scanning types by controlling the terminals X1, X2 and X3. The number of control terminals is not limited and more than three control terminals may be used to obtain m scanning types.

When the resolution is low, arrangement of outputs of the scanning circuits can be changed freely as long as the sample & hold circuits holding the average of outputs of light receiving devices are taken into account, and any number of scanning circuits can be skipped in accordance with the resolution.

The image sensor ICs use photodiodes as sensor devices. Alternatively, phototransistors which are photoelectric conversion devices may be used as the sensor devices. This way the present invention is applicable to a linear image sensor IC and an optical fingerprint sensor that are capable of picking up an arbitrary signal and switching the resolution. If electrostatic capacitance is used in the sensor devices, the present invention is applicable to an electrostatic capacitance type fingerprint sensor capable of picking up an arbitrary signal and switching the resolution. The logic of the terminals X1, X2 and X3 may be changed and controlled so that some of the resolution switching modes or TEST modes are reduced and replaced by a dark level output mode.

As has been described above, the present invention makes it possible to switch between plural resolution levels with the use of the same IC. When the resolution is low, the present invention also makes it possible to set the reading speed to suit the resolution by skipping some scanning circuits in accordance with the resolution or the input voltage of a downstream image processing circuit while avoiding missing data by interconnecting output terminals of light receiving devices and while keeping the output level of the light receiving devices constant for the respective resolution levels by reading the average of outputs of the light receiving devices. The present invention is also free from fixed pattern noise since a dummy switch between light receiving devices is connected between blocks and to the first and last light receiving devices, thus making every light receiving device equal in load capacitance level. In addition, the present invention is capable of improving the quality by detecting through the TEST modes a malfunction due to a process anomaly in switches between light receiving devices.

Furthermore, the present invention uses the same light receiving devices within ICs, the same sample & hold circuits, and the same common signal line so that the dark level can be corrected with high precision when dark level is outputted while factoring in fixed pattern noise inherent to individual ICs due to a voltage drop that results from power supply line resistance unique to long ICs, switching noise, and temperature characteristics.

What is claimed is:

1. An image sensor having a plurality of image sensor ICs mounted linearly thereon, each of the image sensor ICs comprising:

a light receiving device circuit array comprised of a plurality of light receiving devices having output terminals that output output signals in accordance with an amount of light received;

a reset circuit device array that initializes the output terminals of the light receiving devices in an initialization mode;

a plurality of switches that drive the reset circuit device array; and a control circuit that maintains the switches in a conductive state during an accumulation period so that each of the output terminals of the light receiving devices arbitrarily outputs an initialization potential that is a differential between outputs of the output terminals of the light receiving devices of a preselected number of the linear image sensor ICs and successive outputs of the output terminals of the light receiving devices of another of the linear image sensor ICs.

* * * * *